United States Patent [19]

Sudo et al.

[11] Patent Number: 5,021,866
[45] Date of Patent: Jun. 4, 1991

[54] SEMICONDUCTOR INTEGRATED CIRCUIT APPARATUS

[75] Inventors: Toshio Sudo; Kazutaka Saito, both of Kawasaki; Chiaki Takubo, Yokohama, all of Japan

[73] Assignee: Kabushiki Kaisha Toshiba, Kawasaki, Japan

[21] Appl. No.: 250,183

[22] Filed: Sep. 28, 1988

[30] Foreign Application Priority Data

Sep. 28, 1987 [JP] Japan .................................. 62-243103

[51] Int. Cl.⁵ .................................................... H01L 23/48
[52] U.S. Cl. .................................... 357/70; 357/68; 357/74; 357/71; 357/80; 333/238; 333/246; 333/247
[58] Field of Search ................... 357/70, 68, 74, 71, 357/80, 72; 333/33, 238, 246, 247

[56] References Cited

U.S. PATENT DOCUMENTS

| | | | |
|---|---|---|---|
| 3,895,435 | 7/1975 | Turner et al. | 333/238 |
| 4,123,730 | 10/1978 | Fikart | 333/33 |
| 4,494,083 | 1/1985 | Josefsson et al. | 333/246 |
| 4,551,746 | 11/1985 | Gilbert et al. | 357/80 |
| 4,710,798 | 12/1987 | Marcantonio | 357/72 |
| 4,751,482 | 6/1988 | Fukuta et al. | 357/74 |
| 4,799,128 | 1/1989 | Chen | 361/414 |
| 4,827,327 | 5/1989 | Miyauchi et al. | 357/80 |
| 4,835,598 | 5/1989 | Higuchi et al. | 357/72 |
| 4,879,588 | 11/1989 | Ohtsuka et al. | 357/74 |
| 4,899,118 | 2/1990 | Polinski, Sr. | 333/247 |
| 4,922,325 | 5/1990 | Smeltz, Jr. | 357/80 |
| 4,930,002 | 5/1990 | Takenaka et al. | 357/74 |

FOREIGN PATENT DOCUMENTS

| | | | |
|---|---|---|---|
| 0198698 | 10/1986 | European Pat. Off. | 333/247 |
| 58-92101 | 6/1983 | Japan | 333/247 |
| 62-30342 | 2/1987 | Japan | 357/70 |
| 63-209152 | 8/1988 | Japan | 357/70 |
| 81/03396 | 11/1981 | PCT Int'l Appl. | 357/70 |

Primary Examiner—Rolf Hille
Assistant Examiner—Minhloan Tran T.
Attorney, Agent, or Firm—Cushman, Darby & Cushman

[57] ABSTRACT

A semiconductor integrated circuit device including first and second transmission leads formed on both sides of a resin film on which a semiconductor integrated circuit chip is mounted. These leads are connected at portions immediately close to the high-speed input terminals of the chip by through-hole leads. This chip-to-lead configuration according to the present invention is significantly effective for a GaAs logic integrated circuit or the like that processes high-speed input signals.

14 Claims, 6 Drawing Sheets

F I G. I
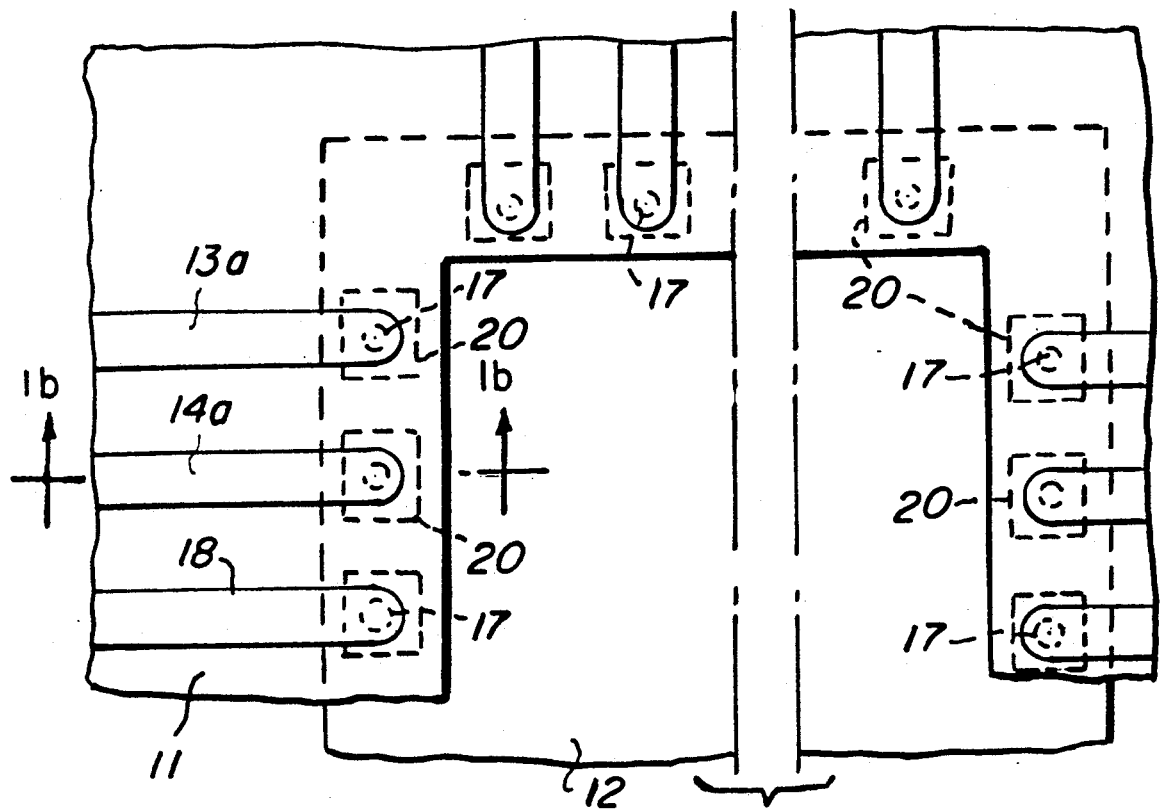
F I G. Ib
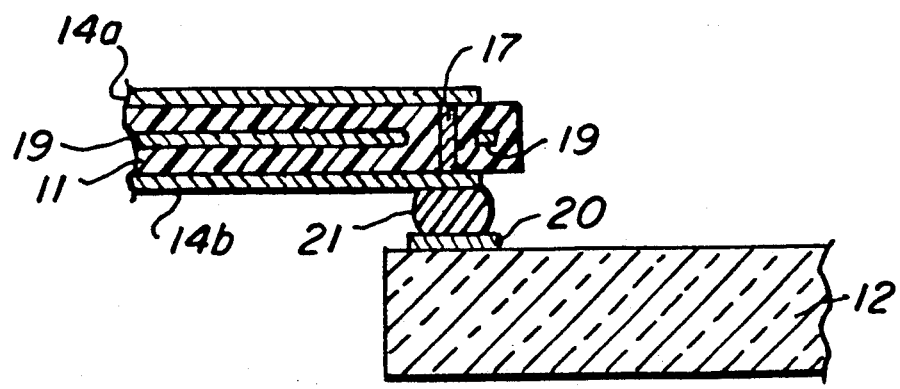

F I G. 4
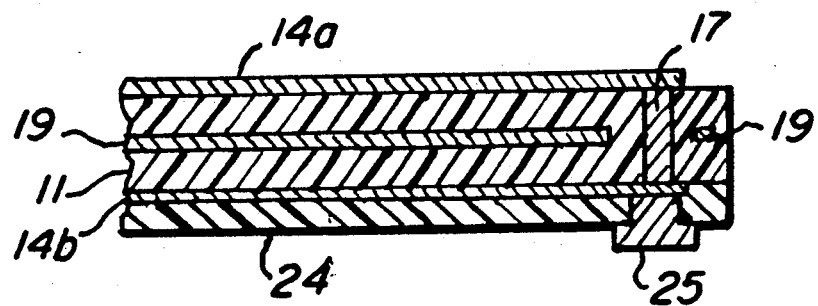

FIG. 7a (PRIOR ART)
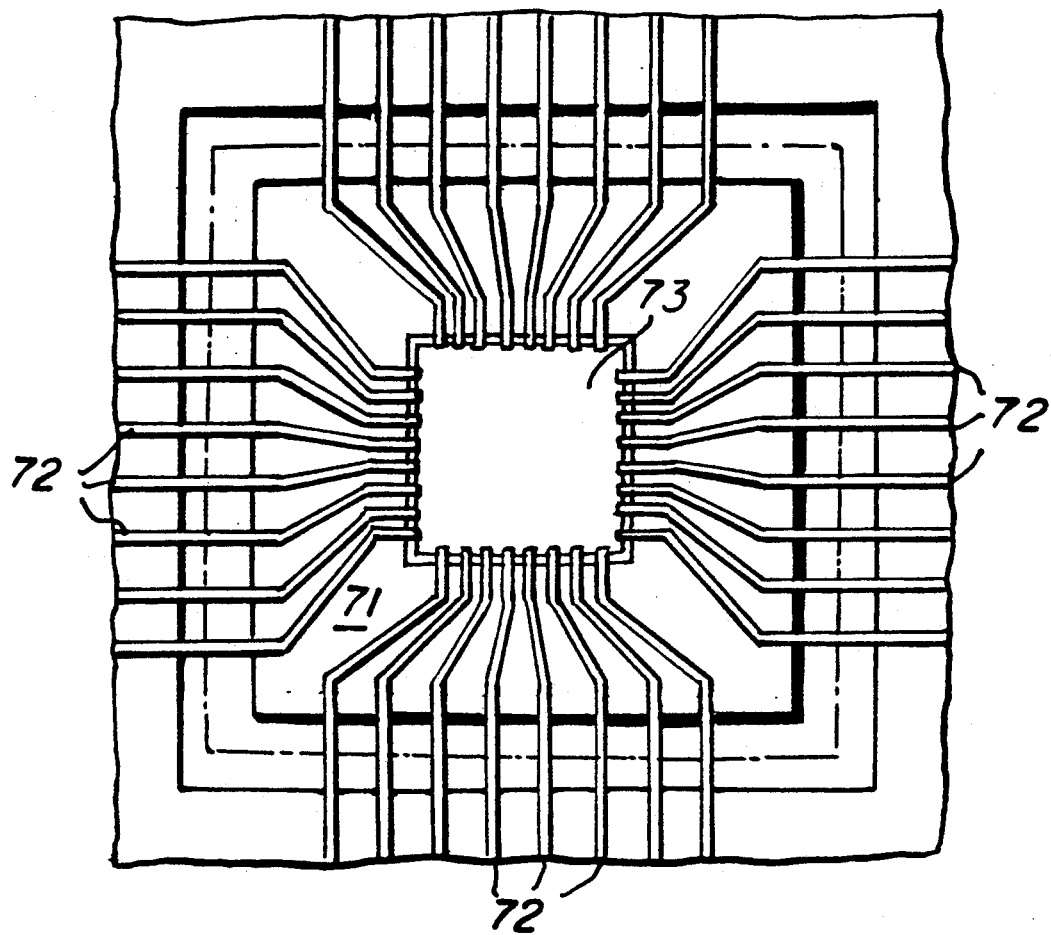
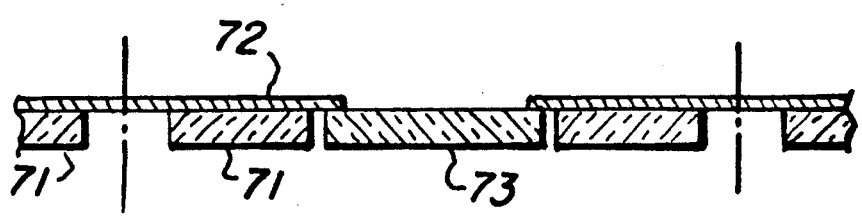
FIG. 7b (PRIOR ART)

SEMICONDUCTOR INTEGRATED CIRCUIT APPARATUS

BACKGROUND OF THE INVENTION

1. Field of the Invention

This invention relates generally to a semiconductor integrated circuit devices, and more particularly to the chip-to-lead configuration of a high-speed performance integrated circuit such as a GaAs (Gallium Arsenide) logic integrated circuit.

2. Description of the Prior Art

There has recently been significant development in the use of compound semiconductor integrated circuits that perform high-speed logic operations at frequencies in GHz. range. For example, an integrated circuit having MESFETs (Metal Semiconductor Field Effect Transistor) integrated on a GaAs substrate has been developed that achieves a high switching-speed on the order of 100 p sec. Furthermore, elements such as a HEMT (High Electron Mobility Transistor) and a HBT (Hetro-Bipolar Transistor) that perform at higher speeds have been steadily developing.

However, there have been problems in that when an integrated circuit chip which performs such a high speed operation is sealed in a package, high-speed performance is inhibited by the package. The degradation of such high-speed performance is caused at least in part by mismatched impedances of termination lead portions that receive high-speed input signals.

When high-speed input signals are fed through the signal leads into MESFETs disposed on the signal receiving sections of a GaAs logic integrated circuit, the signals are reflected at the gates of the MESFETs due to the high input impedances thereof. This reflection causes distortion of the signal waveform, and this distortion interferes with the normal logic operations. To prevent this, matching resistors are provided so as to make proper termination. For example, a GaAs logic integrated circuit chip is sealed in a conventional package and matching terminal resistors are disposed at the ends of leads which are signal input terminals.

FIG. 5 shows an equivalent circuit with such terminal resistors disposed at the end of a lead as a termination impedance. The overall arrangement includes a package 51, an integrated circuit chip 52 incorporated within the package, an inner lead 53, a MESFET 54 which is the input section of the integrated circuit chip, and a terminal resistor 55. However, in the case of a high speed integrated circuit having a switching speed on the order of 100 p sec or faster, the signal reflection problem cannot be completely solved by the use of such a matching terminal resistor disposed outside the package 51.

The configuration effectively acts like an "open stub" because the terminal resistor 55 is disposed at a point A faraway from a point B which is the gate of MESFET 54 within the package 51. Signal reflection causes ringing of input signals which results from the existence of such an open stub. To avoid this open stub, it would be necessary to incorporate the terminal resistor 55 within the package 51 in close proximity to the integrated circuit chip 52. There is contemplated an arrangement in which terminal resistors are disposed by thick-film printing within the package, or an arrangement in which chip resistors are provided. However, the inside of the package is usually not flat but stepwise, thus, it is difficult to form resistors by thick-film printing. Moreover, when a chip resistor is incorporated within the package, this requires a larger space therein. Thus such a solution is not practical.

FIG. 6 shows another so-called "feed-through" arrangement in which a terminal resistor is disposed in a manner different from that shown in FIG. 5. In FIG. 5, a first signal lead 63a from an input terminal point A of a package 61 is led through a gate terminal point B of a MESFET 64 so as to be connected through a second signal lead 63b to another terminal point C of the package 61. Namely, first and second signal leads are folded at the gate terminal point B. A terminal resistor 65 is disposed at the input terminal pint C. In this arrangement, the length of open stub becomes shorter compared to that in the FIG. 5 arrangement. However, the number of input signal leads is doubled. Therefore, as the density of integrated circuits becomes greater the number of input terminals increases and bonding pads become more dense, resulting in difficulty in connecting leads within the package. Further, in the vicinity of an input point B of folded first and second leads 63a and 63b, a branching portion 66 must be provided. The impedance branching portion 66 causes a problem in the transmission of high-speed signal waveforms.

The arrangements of both FIGS. 5 and 6 have a wire-bonding problem. When the wire-bonding is made between leads within the package and terminals on the chip of integrated circuit, the wire is usually connected in an arc. This arc-shaped bonding wire also appears to be an open stub to an integrated circuit that processes high-speed signals on the other of gigabits/sec. Thus, the length of such bonding wire cannot be ignored, and variation in length renders the characteristics of the integrated circuit non-uniform. When the density of integrated circuits becomes greater thereby causing the bonding pads to be more densely formed, the following problems also arise. First, a tool used for bonding inevitably contacts with neighboring wires such that bonding operations become impossible. Second, the size and pitch of bonding pads cannot be reduced smaller than some extent, thus the reduction in size of the integrated circuit is inevitably limited. Consequently, the length of signal leads on the chip cannot be reduced.

In order to solve the above-described problems in wire bonding, there has been provided a TAB (Tape Automated Bonding) method in which the integrated circuit chips are united on a flexible resin film. FIGS. 7a and 7b are diagrams illustrating a conventional base film for use in TAB method. FIG. 7a is a plan view of an essential portion of the base film, and FIG. 7b is a cross-sectional view thereof. In FIG. 7a, on an insulating polyamide film 71, leads 72 are formed substantially radially from a chip-mounting portion. In the chip-mounting portion, an opening is made in which an integrated circuit chip 73 is mounted. The thus mounted chip 73 has in its periphery a plurality of pads to which each end of leads 72 is respectively connected through bump electrodes. The film 71 is usually a lengthy tape on which a number of integrated circuit chip are mounted. The respective chips are separated for use by cutting off the film along the dot-and-dash line shown in FIGS. 7a and 7b. This TAB method is also called a film carrier method.

In the TAB method, the chip and leads are connected at bump electrodes, so that the inductance thereof are smaller than that in the wire-bonding method. However, in such a conventional TAB method, the signal transmission of the above-described high-speed logic integrated circuit has not been considered. Specifically, the characteristic impedance of leads on the TAB substrate is not taken into consideration, thus the reflection of signals arises due to mismatched impedance. Further, in the vicinity of the integrated circuit chip, lead pitch becomes extremely small, thus, crosstalk between leads increases. For these reasons, the high-speed signals of integrated circuit cannot be transferred with signal fidelity. This causes erroneous operations of the integrated circuit.

As described above, in the conventional chip-to-lead configuration of semiconductor integrated circuits, there have been problems such that high-speed performance cannot be fully extracted from a high-speed integrated circuit chip such as a GaAs logic integrated circuit chip.

SUMMARY OF THE INVENTION

Accordingly, one object of the present invention is to provide an improved semiconductor integrated circuit apparatus, and more particularly to provide an improved feed-through type terminating configuration. This configuration is particularly well suited for high-speed input signals in a semiconductor integrated circuit apparatus wherein a semiconductor integrated circuit chip is mounted on an insulating film.

The semiconductor integrated circuit apparatus includes a semiconductor integrated circuit chip mounted on the insulating film on which lead patterns are formed. The semiconductor integrated circuit apparatus comprises first transmission leads formed on one surface of the insulating film, second transmission leads formed on the other surface of the insulating film, and through-hole leads that connect the first and second transmission leads by piercing through the insulating film at terminal sections of the integrated circuit chip.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1a through 1d are diagrams illustrating the chip-to-lead configuration of a GaAs logic integrated circuit apparatus of one embodiment according to the present invention, FIG. 1a is a plan view of the essential portion thereof, FIG. 1b is a cross-sectional view taken along line A—A of FIG. 1a, FIG. 1c is a rear view of the essential portion of FIG. 1a, and FIG. 1d is a plan view of an intermediate ground conductor shown in FIG. 1b;

FIG. 2a is a plan view, FIG. 2b is a cross-sectional view taken along line A—A of FIG. 2a, and FIG. 2c is a rear view;

FIG. 3a is a plan view, FIG. 3b is a cross-sectional view taken along line A—A of FIG. 3a and FIG. 3c is a rear view.

FIG. 4 is a cross-sectional view illustrating the chip-to-lead configuration of still other embodiment according to the present invention;

FIGS. 7a and 7b are diagrams illustrating a conventional base film for use in a TAB method; FIG. 7a is a plan view of the essential portion thereof, and FIG. 7b is a cross-sectional view.

DESCRIPTION OF THE PREFERRED EMBODIMENTS

Figure 1C:
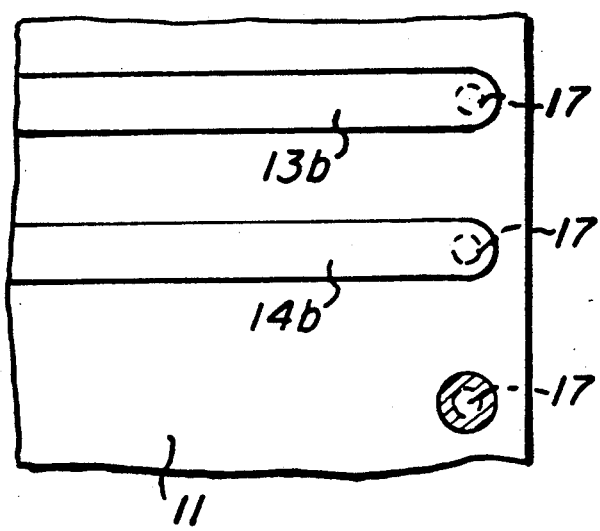
Figure 1D:
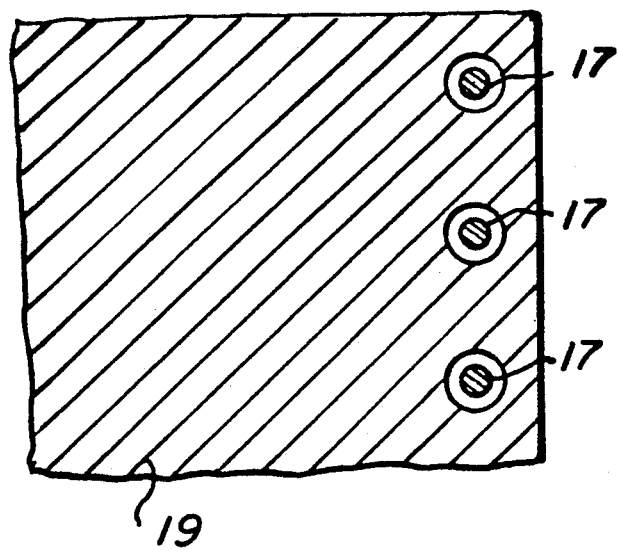

Referring now to the drawings, wherein like reference numerals designate identical or corresponding parts throughout the several views, and more particularly to FIG. 1 thereof, one embodiment of this invention will be described. In this embodiment, a TAB (Tape Automated Bonding) method is employed for connecting signal leads to the semiconductor integrated circuit chip. Those signal leads on the TAB base which are connected to high speed signal input terminals of the integrated circuit chip are formed in laminated feed-through configuration.

Each of the feed-through type leads includes a first transmission lead formed on one side of a resin film, a second transmission lead formed on the other side of the resin film, and a through-hole lead that connects these transmission leads by piercing through the resin film at the signal input terminal section of the integrated circuit chip. The first and second transmission leads are preferably formed in a micro-strip transmission line configuration, or in a co-planer transmission line configuration or a combination of these. Terminal resistors may be disposed either within or outside the TAB base.

In this embodiment, as a GaAs logic integrated circuit, a multiplexer, which includes GaAs MESFETs, is used for example. The multiplexer performs high-speed switching operations faster than 10 p sec. The TAB base film is a resin film of polyamide or of glass epoxy on which lead patterns are formed by utilizing photo-etching procedures.

FIGS. 1a through 1d show the TAB base film on which an integrated circuit chip is mounted and the peripheral leads thereof. Specifically, in FIG. 1a, in a chip-mounting portion of a resin film 11, an opening is made. The GaAs logic integrated circuit chip 12 is mounted in this opening. Leads on the resin film 11 are Cu films formed on the pattern which is arranged substantially radially from the chip-mounting portion.

Taking note of particular leads which are connected to the high-speed input terminals of the integrated circuit chip 12, such leads for high-speed input signals are formed as follows. These high-speed input signal leads are constituted by first transmission leads 13a and 14a formed on one side of the resin film 11, second transmission leads 13b and 14b formed on the other side of the resin film 11 (shown in FIG. 1c), and through-hole leads 17 piercing through the resin film 11 in the regions where connection to the chip 12 are made.

The first transmission lead 13a and the second transmission lead 13b together constitute a pair of input leads. Similarly, the first transmission lead 14a and the second transmission lead 14b together constitute a pair of input leads. The pairs of leads 13a and 13b and leads 14a and 14b are respectively overlapped sandwiching the resin film 11, and interconnected by through-hole leads 17, whereby a so-called feed-through configuration is constituted. In addition to these signal input leads, a lead 18, for example, is connected by one of through-hole leads 17 to the back of the resin film 11. However, as can be seen from FIG. 1c, unlike the case of transmission leads such as leads 13a and 13b or 14a and 14b, the lead 18 is not provided with a fold-back lead of laminated configuration. This configuration of the lead 18 may be employed for leads other than high-speed signal input leads, such as output leads, reference voltage leads and power source leads, for example.

In the intermediate portion in the direction of the thickness of the resin film 11, a ground conductor film 19 is implanted as shown in FIG. 1b. The ground conductor film 19 is implanted in substantially whole area as observed in a plane shown in FIG. 1d. This enables the first and second transmission leads 13a and 14a, and 13b and 14b to constitute micro-strip transmission lines.

As shown in FIG. 1b, the connection between a pad 20 on the integrated circuit chip 12 and leads 14a and 14b on the resin film 11 is made by using a bump electrode 21. In FIG. 1b, the bump electrode 21 is provided at a position close to the through-hole lead 17. However, this bump electrode 21 may previously be formed on either side of the resin film 11 or side of the integrated circuit chip 12. The bump electrode 21, when formed on the side of the integrated circuit chip 12, is usually formed by Au-plating through a barrier metal layer such as Ti-Ni-Pd, Ti-W-Au, Ti-Pt-Au, and Cr-Cu-Au. In this case, as a preferable state, the side of the resin film 11 is also previously plated with Sn or Au. In order to perform connection, a tool heated to 350° C.–500° C. is pressed against the lead 14a on the resin film 11 at a position close to the through-hole lead 17. Thus, leads 14a and 14b on the resin film 11 are connected through the bump electrode 21 to the pad 20 on the chip 12. Heat of the tool is conveyed through the through-hole lead 17 to the bump contact 21, so that preferable connection is completed. Here, a terminal resistor may be disposed either outside the TAB base film, for example, on a printed circuit board on which the TAB base film is mounted, or on the TAB base film.

According to this embodiment of the present invention, a feed-through type configuration is formed on the TAB base film. Thus, signal input leads with constant characteristic impedance can be readily formed even in the case of an integrated circuit with a large number of signal input terminals. Moreover, the feed-through type configuration is formed in a fold-back fashion in the direction of the thickness of the integrated circuit chip 12. Further, the pad 20 on the chip 12 and leads on the TAB base film are connected at the immediately under the through-hole lead 17 through the bump electrode 21. Thus, the inner leads of the chip 12 can be formed with higher density and unnecessary branches can be avoided without any disadvantages. Therefore, an ideal state in terms of high-speed signal transmission can be achieved.

Figure 2A:
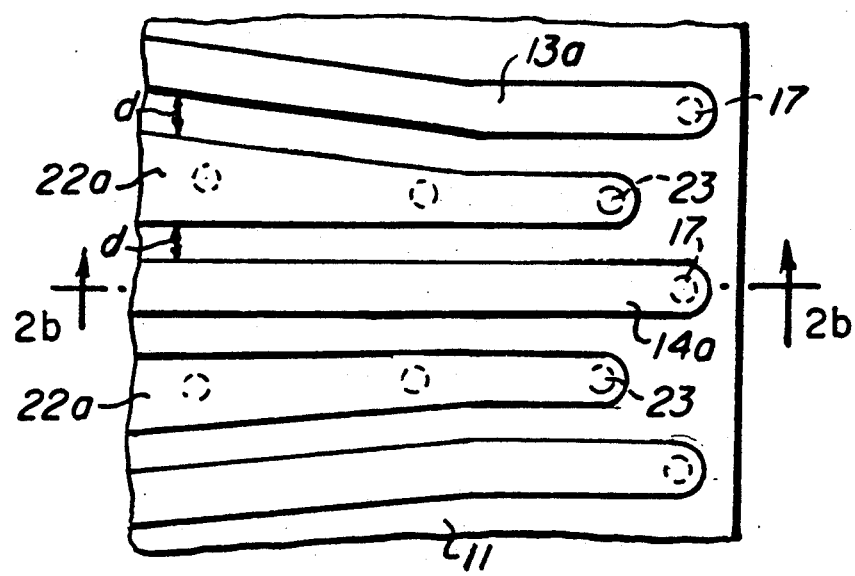
FIGS. 2a through 2c are diagrams illustrating the chip-to-lead configuration of another embodiment according to the present invention.
Figure 2B:
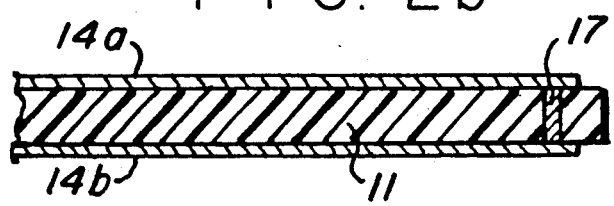
Figure 2C:
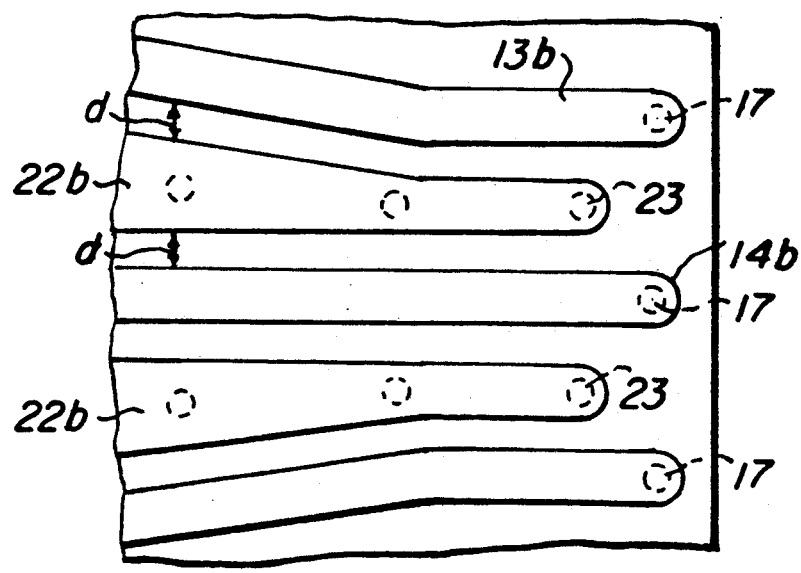

FIGS. 2a through 2c are diagrams illustrating a chip-to-lead configuration of another embodiment according to the present invention. FIG. 2a is a plan view, FIG. 2b is a cross-sectional view taken along line A—A of FIG. 2a, and FIG. 2c is a rear view.

In the FIGS. 1a and 1b embodiment, a micro-strip transmission line configuration was employed, however, in this embodiment, a co-planer transmission line configuration is employed. Specifically, on the both sides of a resin film 11, ground conductor films 22a and 22b are formed, i.e., on the same plane on which first transmission leads 13a and 14a and second transmission leads 13b and 14b are formed with a distance d with respect to the ground conductor films 22a and 22b. The distance d is maintained constant throughout the plane so as to establish specified characteristic impedance. In this embodiment, the ground conductor films 22a and 22b on both sides of resin film 11 are interconnected through a plurality of through-hole leads 23 at plural positions.

In this embodiment, the same advantages as those of the previously described embodiment can be obtained. In particular, by virtue of the co-planer transmission line configuration, the isolation between high-speed signals can be enhanced. Thus, waveform distortions caused by crosstalk between leads are prevented.

Figure 3A:
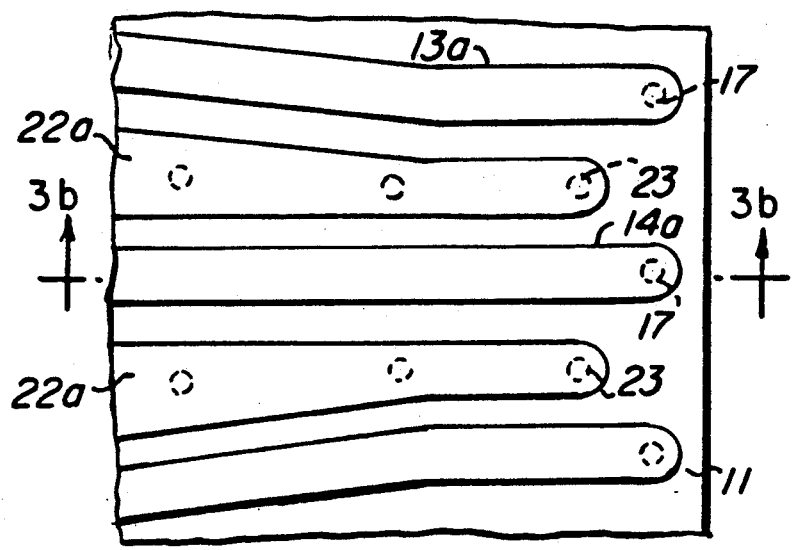
FIGS. 3a through 3c are diagrams illustrating the chip-to-lead configuration of still another embodiment according to the present invention.
Figure 3B:
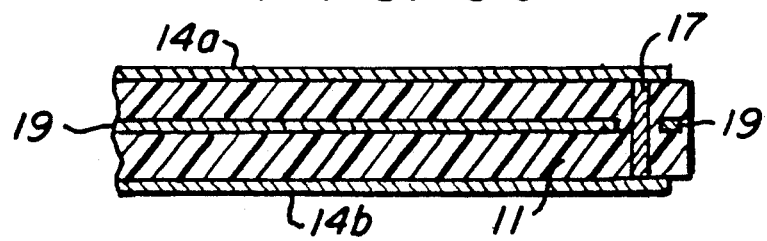
Figure 3C:
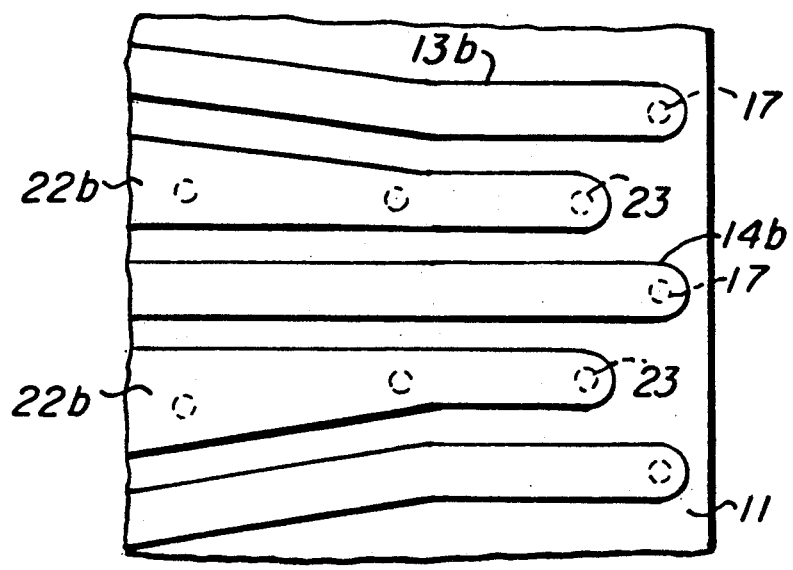
Figure 5:
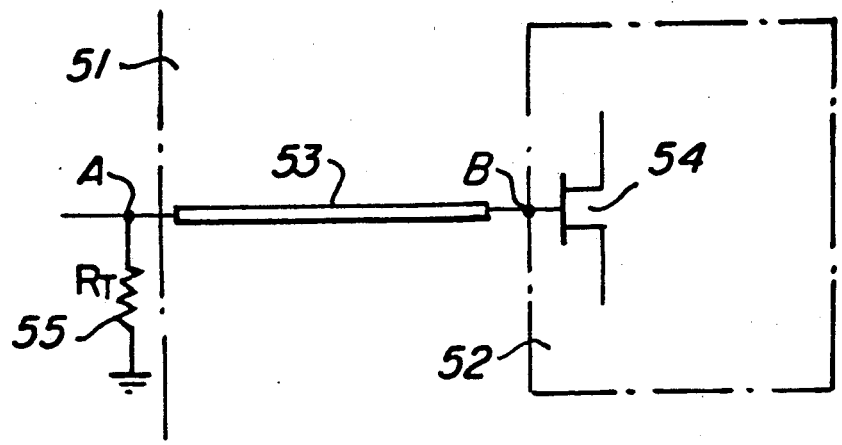
Figure 6:
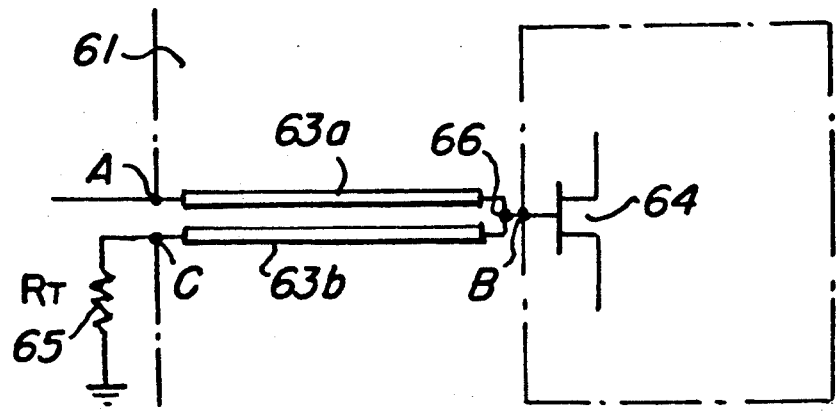

FIGS. 3a through 3c are diagrams illustrating a chip-to-lead configuration of still another embodiment according to the present invention. FIG. 3a is a plan view, FIG. 3b is a cross-sectional view taken along line A—A of FIG. 3a, and FIG. 3c is a rear view. In this embodiment, first and second transmission leads are formed in the configuration of combination of a micro-strip transmission line configuration and a co-planer transmission line configuration. Thus, in this embodiment, the same advantages as those of the previous embodiments can be obtained.

FIG. 4 is a cross-sectional view illustrating an essential portion of a TAB base of still another embodiment according to the present invention. As can be seen in comparison with FIG. 3b, in this embodiment, transmission leads on the back side of resin film 11 are covered with an insulating film 24. Contact holes are made in the insulating film 24. In the contact holes, connecting electrodes 25 are provided to interconnect between the leads and an integrated circuit chip. When the TAB base film is mounted on a printed circuit board, the insulating film 24 is effective for insulating printed circuits on the board.

According to the present invention, a TAB method is employed, and on the TAB base film, a feed-through type configuration is formed in a fold-back fashion in the direction of the thickness of a resin film. This can achieve an integrated circuit apparatus of high density that can readily correspond to an increase of the number of input terminals and that can sufficiently exhibit the high-speed performance of the integrated circuit chip.

Obviously, numerous additional modifications and variations of the present invention are possible in light of the above teachings. It is therefore to be understood that within the scope of the appended claims, the invention may be practiced otherwise than as specifically described herein.

We claim:

1. A semiconductor integrated circuit apparatus, comprising:
   an insulating film having first and second sides;
   a semiconductor integrated circuit chip having terminal portions and being disposed in parallel alignment with the film;
   first transmission leads formed on said first side of said insulating film and having termini disposed in alignment with the semiconductor terminal portions;
   second transmission leads formed on said second side of said insulating film, each of said second transmission leads having a corresponding first transmission lead and being the same shape as its corresponding first transmission lead and substantially completely overlapping its corresponding first transmission lead; and
   through-hole leads passing through said insulating film and through the termini of corresponding first and second transmission leads and formed at respective terminal portions of said integrated circuit chip and connecting corresponding ones of said first and second transmission leads to one another and to said respectively integrated circuit terminal portions.

2. A semiconductor integrated circuit device according to claim 1 wherein said insulating film is a resin film.

3. A semiconductor integrated circuit device according to claim 1, further comprising ground conductor film formed within said insulating film between said first transmission leads and said second transmission leads.

4. A semiconductor integrated circuit device according to claim 3, further comprising a second insulating film in contact with said second transmission leads.

5. A semiconductor integrated circuit device according to claim 1, further comprising pairs of ground conductor films one film of each pair being formed on said first side of said insulating film and the other film of each pair being formed on said second side of said insulating film.

6. A semiconductor integrated circuit device according to claim 5, wherein a pair of said ground conductor films are connected to one another by a through-hole lead passing through said insulating film.

7. A semiconductor integrated circuit device according to claim 5, further comprising ground conductor films formed within said resin film.

8. A semiconductor integrated circuit device according to claim 7, further comprising a second insulating film in contact with said second transmission leads.

9. A semiconductor integrated circuit device according to claim 5, wherein said semiconductor integrated circuit chip is a GaAs logic integrated circuit.

10. A semiconductor integrated circuit device according to claim 1, wherein said semiconductor integrated circuit chip is a GaAs integrated circuit.

11. A semiconductor integrated circuit device according to claim 1, wherein said first and second transmission leads are connected to high-speed signal input terminals of said semiconductor integrated circuit.

12. A semiconductor integrated circuit device according to claim 1, further comprising a second insulating film in contact with said second transmission leads.

13. A semiconductor integrated circuit apparatus, comprising:
an insulating film having first and second sides;
a semiconductor integrated circuit chip having terminal portions and being disposed in parallel alignment with the film;
first transmission leads formed on said first side of said insulating film;
second transmission leads formed on said second side of said insulating film, each of said second transmission leads having a corresponding first transmission lead and substantially completely overlapping its corresponding first transmission lead; and
through hole leads passing through said insulating film and connecting corresponding ones of said first and second transmission leads.

14. A semiconductor integrated circuit apparatus, comprising:
an insulating film having first and second dies;
a semiconductor integrated circuit chip having terminal portions and being disposed in parallel alignment with the film;
first transmission leads formed on said first side of said insulating film;
second transmission leads formed on said second side of said insulating film, each of said second transmission leads having a corresponding first transmission lead and being the same shape as, and substantially completely facing its corresponding first transmission lead; and
through hole leads passing through said insulating film and connecting corresponding ones of said first and second transmission leads and being connected to corresponding terminal portions of said integrated circuit.

* * * * *